(12) United States Patent
Yamada

(10) Patent No.: US 9,793,450 B2
(45) Date of Patent: Oct. 17, 2017

(54) LIGHT EMITTING APPARATUS HAVING ONE OR MORE RIDGE STRUCTURES DEFINING AT LEAST ONE CIRCLE AROUND A COMMON CENTER

(71) Applicant: Samsung Electronics Co., Ltd., Suwon-si, Gyeonggi-do (KR)

(72) Inventor: Yukika Yamada, Kanagawa-ken (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/196,944

(22) Filed: Jun. 29, 2016

(65) Prior Publication Data

US 2017/0148958 A1 May 25, 2017

(30) Foreign Application Priority Data

Nov. 24, 2015 (JP) .................................. 2015-229157
Jan. 11, 2016 (KR) ......................... 10-2016-0003149

(51) Int. Cl.
*H01L 33/54* (2010.01)
*H01L 33/20* (2010.01)
*H01L 33/22* (2010.01)
*H01L 33/50* (2010.01)

(52) U.S. Cl.
CPC .............. *H01L 33/54* (2013.01); *H01L 33/20* (2013.01); *H01L 33/22* (2013.01); *H01L 33/505* (2013.01); *H01L 33/507* (2013.01)

(58) Field of Classification Search
CPC ......... H01L 33/54; H01L 33/20; H01L 33/22; H01L 33/505; H01L 33/507
See application file for complete search history.

(56) References Cited

U.S. PATENT DOCUMENTS

| 6,372,608 | B1 | 4/2002 | Shimoda et al. |
| 6,645,830 | B2 | 11/2003 | Shimoda et al. |
| 6,686,676 | B2 * | 2/2004 | McNulty ................ B82Y 20/00 313/112 |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |

(Continued)

FOREIGN PATENT DOCUMENTS

JP 2010103404 A 5/2010
KR 10-0765469 B1 10/2007

(Continued)

*Primary Examiner* — Ida M Soward
(74) *Attorney, Agent, or Firm* — Harness, Dickey & Pierce P.L.C.

(57) ABSTRACT

A light emitting device includes a light emitting device on a substrate; an encapsulation layer covering the light emitting device; and a texture layer on the encapsulation layer. A surface of the texture layer has a ridge structure. A radial cross section of the ridge structure has a triangular shape with a distal vertex relative to the encapsulation layer surface. The distal vertex has one or more altitude angles, and the one or more altitude angles are less than or equal to 40 degrees.

17 Claims, 9 Drawing Sheets

(56) References Cited

U.S. PATENT DOCUMENTS

| | | |
|---|---|---|
| 7,154,124 B2 | 12/2006 | Han et al. |
| 7,208,725 B2 | 4/2007 | Sherrer et al. |
| 7,256,428 B2 | 8/2007 | Braune et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,324,647 B2 * | 12/2012 | McKenzie ............ H01L 33/507 257/98 |
| 8,360,593 B2 | 1/2013 | Kim et al. |
| 8,368,097 B2 * | 2/2013 | Kim ....................... H01L 33/54 257/98 |
| 8,399,944 B2 | 3/2013 | Kwak et al. |
| 8,415,696 B2 * | 4/2013 | Park ..................... G02B 5/1876 257/98 |
| 8,432,511 B2 | 4/2013 | Jeong |
| 8,459,832 B2 | 6/2013 | Kim |
| 8,486,724 B2 | 7/2013 | Ku et al. |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,946,747 B2 * | 2/2015 | Reiherzer ............. H01L 33/505 257/100 |
| 8,957,580 B2 * | 2/2015 | Reiherzer ................. F21V 9/16 313/498 |
| 9,366,395 B2 * | 6/2016 | Petersen ............... H01L 33/505 |
| 9,515,132 B2 * | 12/2016 | Sato .................... H01L 27/3279 |
| 2008/0308825 A1 * | 12/2008 | Chakraborty ........... H01L 33/56 257/98 |
| 2010/0127291 A1 * | 5/2010 | Chang ..................... H01L 33/54 257/98 |
| 2011/0001157 A1 * | 1/2011 | McKenzie ............ H01L 33/507 257/98 |
| 2012/0026720 A1 * | 2/2012 | Cho ..................... G02B 5/0242 362/84 |
| 2012/0080085 A1 * | 4/2012 | Honeker .................. B32B 3/28 136/256 |
| 2013/0026515 A1 | 1/2013 | Chen |
| 2016/0111684 A1 * | 4/2016 | Savas ................. H01L 51/5256 257/40 |
| 2016/0126430 A1 * | 5/2016 | Ng .......................... H01L 33/54 257/98 |
| 2016/0238443 A1 * | 8/2016 | Chu ................... A61B 5/14552 |

FOREIGN PATENT DOCUMENTS

| | | |
|---|---|---|
| KR | 10-1028316 B1 | 4/2011 |
| KR | 10-1103908 B1 | 1/2012 |
| KR | 10-1223411 B1 | 1/2013 |
| KR | 20150109591 A | 10/2015 |

* cited by examiner

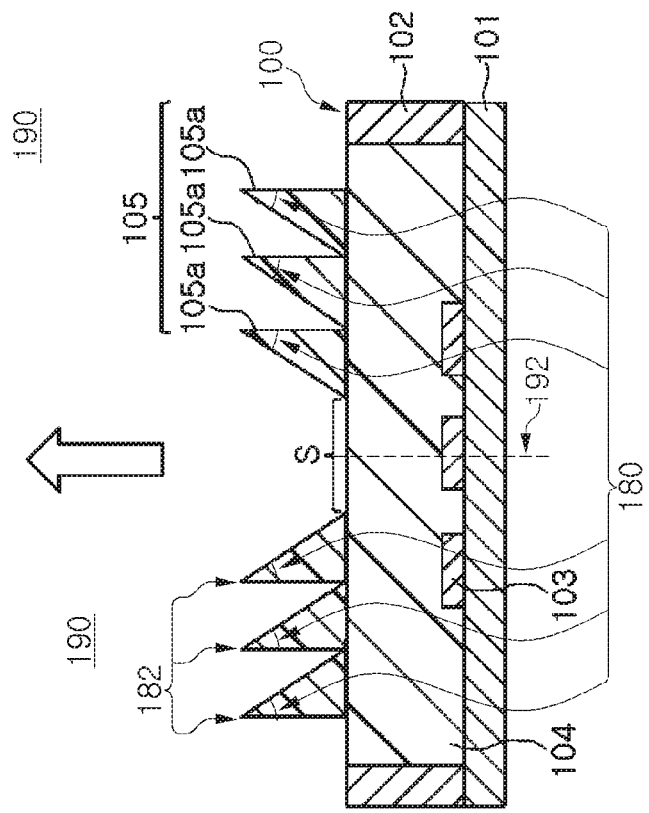
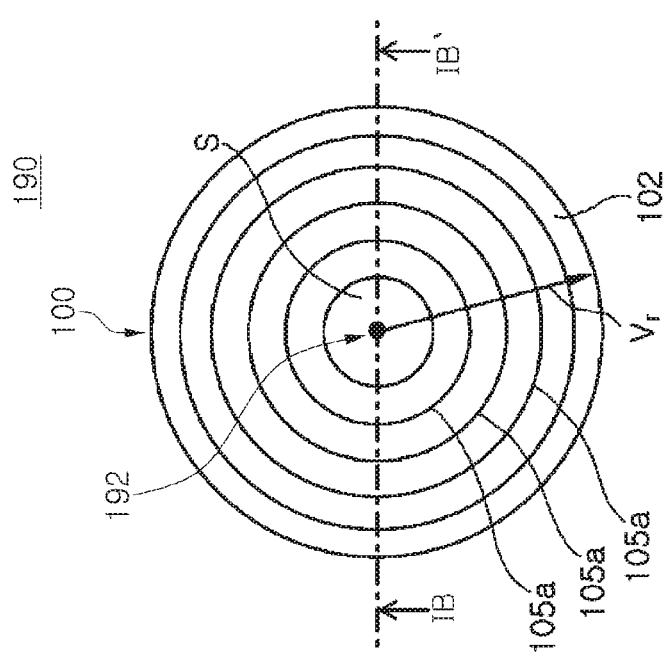
FIG. 1A
FIG. 1B

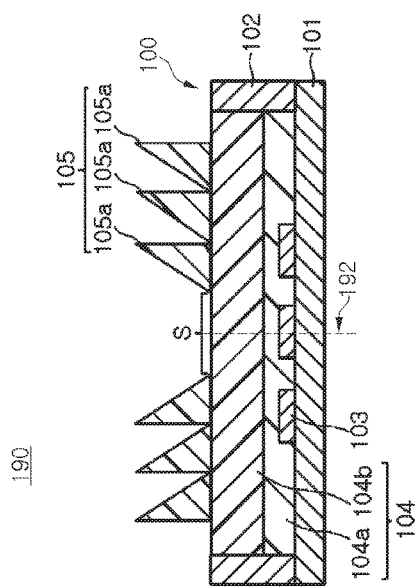
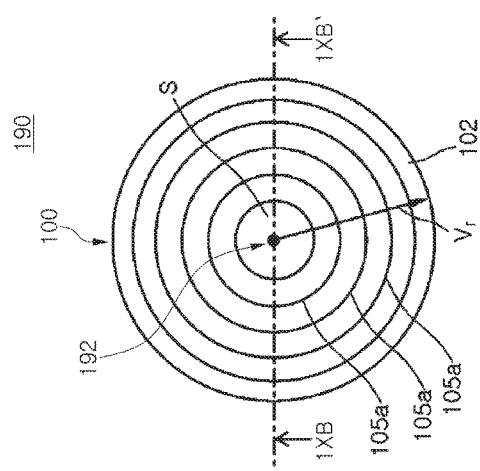
FIG. 9A
FIG. 9B

LIGHT EMITTING APPARATUS HAVING ONE OR MORE RIDGE STRUCTURES DEFINING AT LEAST ONE CIRCLE AROUND A COMMON CENTER

CROSS-REFERENCE TO RELATED APPLICATIONS

This application claims benefits of priorities to Japanese Patent Application No. 2015-229157, filed on Nov. 24, 2015 and Korean Patent Application No. 10-2016-0003149, filed on Jan. 11, 2016 with the Korean Intellectual Property Office, the disclosures of which are incorporated herein by reference in their entirety.

BACKGROUND

The inventive concepts relate to a light emitting apparatus, and more particularly, to a light emitting apparatus using a light emitting device.

In recent years, high efficiency of a light emitting apparatus using a light emitting diode (hereinafter referred to as an LED) as a light emitting device is being pursued.

An LED is a semiconductor device that includes a P-type semiconductor and an N-type semiconductor bonded to each other. In the LED, electrons and holes may be combined with each other in a junction when a level of voltage is applied to the junction. The LED may emit light having a level of energy corresponding to a band gap between the P-type semiconductor and the N-type semiconductor.

An LED may be compact and lightweight, may enable generation of a lower magnitude of heat, may have a relatively long lifespan, and may have a fast response time, in comparison to an incandescent lamp. An LED may be included in one or more various types of light emitting apparatuses, including electric lights.

A light emitting apparatus using an LED generally includes an LED chip and an encapsulation layer covering and protecting the LED chip. Light emitted from the LED chip may be externally emitted from a surface of the encapsulation layer. However, because a refractive index of the encapsulation layer is greater than that of air, a relatively large portion of light emitted from the LED chip is reflected to the encapsulation layer at an interface between the encapsulation layer and the air, thereby hindering high efficiency of the light emitting apparatus.

An angle at which light emitted from an LED is received to a surface of an encapsulation layer is within a wide range. Therefore, even in a case in which only a protrusion such as a pyramid is formed on the surface of the encapsulation layer, a part or the whole of light emitted from the LED to be received to the surface of the protrusion is reflected, the reflected light returns in a direction opposite to a direction in which light is emitted by a light emitting apparatus, and is attenuated by a collision with a phosphor included in the encapsulation layer. The prior art has a problem in that light reflected from the surface of the protrusion may not be extracted as light emitted from the light emitting apparatus.

The intensity of light emitted from the LED becomes greatest in a direction in which the light is received to the surface of the encapsulation layer at an incident angle of about 45 degrees, but the prior art also has a problem in that the light received to the surface of the encapsulation layer at the incident angle may not be properly extracted as light emitted from the light emitting apparatus.

SUMMARY

According to at least one example embodiment of the inventive concepts, a light emitting apparatus may include a light emitting device on a substrate, an encapsulation layer covering the light emitting device, and a texture layer on the encapsulation layer. The texture layer may include at least one ridge structure defining at least one circle around a common center. The at least one ridge structure may have a radial cross section. The radial cross section may have a triangular shape. The triangular shape may have a distal vertex that is distal from the encapsulation layer. Each altitude angle of the distal vertex may be less than or equal to 40 degrees, respectively.

According to some example embodiments, a light emitting apparatus may include: a light emitting device on a substrate; a first encapsulation layer covering the light emitting device; a second encapsulation layer on the first encapsulation layer; and a texture layer on the second encapsulation layer. A surface of the texture layer may include a plurality of concentric ridge structures. A radial cross section of each of the concentric ridge structures may have a triangular shape in which an altitude line of a distal vertex of the triangular shape relative to the encapsulation layer, and side surfaces forming the distal vertex, form angles less than or equal to 40 degrees, respectively.

According to at least one example embodiment of the inventive concepts, a light emitting apparatus may include a light emitting device on a substrate, a first encapsulation layer covering the light emitting device, a second encapsulation layer on the first encapsulation layer, and a texture layer on the second encapsulation layer. The texture layer may include at least one ridge structure defining at least one circle around a common center. The at least one ridge structure may have a radial cross section. The radial cross section may have a triangular shape. The triangular shape may have a distal vertex that is distal from the encapsulation layer. Each altitude angle of the distal vertex may be less than or equal to 40 degrees, respectively.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIG. 1A is a plan view illustrating a structure of a light emitting apparatus, according to at least one example embodiment;

FIG. 1B is a cross-sectional view illustrating a structure of a light emitting apparatus, according to at least one example embodiment;

FIG. 9A is a plan view illustrating a structure of a light emitting apparatus manufactured by the method of manufacturing a light emitting apparatus, according to at least one example embodiment; and FIG. 9B is a cross-sectional view illustrating the structure of the light emitting apparatus manufactured by the method of manufacturing a light emitting apparatus, according to at least one example embodiment.

DETAILED DESCRIPTION

Figure 2A:
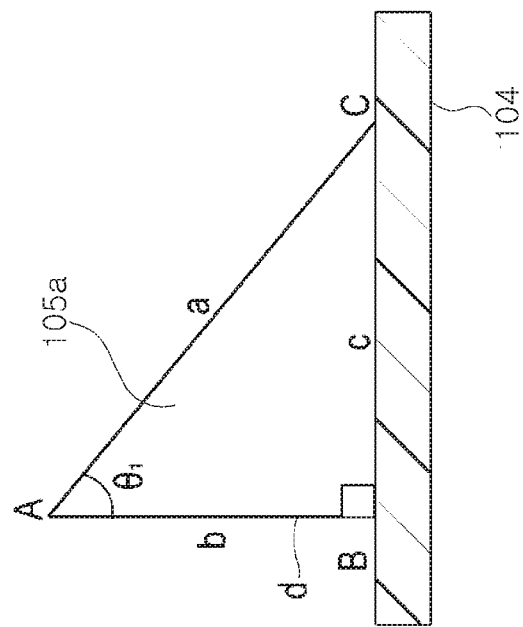
FIG. 2A and FIG. 2B are views illustrating cross sections of a ridge structure, respectively, according to at least one example embodiment.

Example embodiments of a light emitting apparatus will hereinafter be described in more detail with reference to the drawings.

As described herein, an interface between a single layer and the other layer (including air) may be referred to as a surface of the single layer. In the drawings, the dimension and ratio of each component are exaggerated for convenience of description, and may be different from the actual dimension and ratio.

FIG. 1A is a plan view illustrating a structure of a light emitting apparatus, according to at least one example embodiment. FIG. 1B is a cross-sectional view illustrating a structure of the light emitting apparatus, according to at least one example embodiment. FIG. 1A is a plan view of a light emitting apparatus 100. FIG. 1B is a cross-sectional view taken along line IB-IB' of FIG. 1A. FIGS. 1A and 1B illustrate a chip onboard (COB) structure as an example of a structure of the light emitting apparatus 100.

The light emitting apparatus 100 may include a substrate 101, a mold frame 102, light emitting diodes (LEDs) (103), an encapsulation layer 104, and a texture layer 105.

The substrate 101 may include an alumina ($Al_2O_3$), aluminum (Al), or silicon (Si) plate-like body, or may include an aluminum plate-like body having an $Al_2O_3$ and/or Si layer provided thereon. The substrate 101 may have an electrode (not illustrated) provided thereon to supply power to each of the LEDs 103.

The mold frame 102 may be a round wall provided on the substrate 101, and may function as a dam blocking a Si resin or the like, a material of the encapsulation layer 104, when the encapsulation layer 104 covering the LEDs 103 is formed. Accordingly, the mold frame 102 may be configured to surround the encapsulation layer 104 disposed inside the mold frame 102. The mold frame 102 may have a function of controlling a direction of light so as to externally irradiate light from a surface of the texture layer 105 by reflecting the light emitted from the LEDs 103. The mold frame 102 may be formed by using $Al_2O_3$ and/or a Si resin.

The LEDs 103 may form light emitting devices, and may be LED chips configured by using semiconductors having energy band gaps corresponding to optical energy of blue light. The LEDs 103 may emit blue light by receiving voltage in a forward direction. The number of the LEDs 103 mounted in the light emitting apparatus 100 is not limited, and may be singular or plural. The LEDs 103 may be connected to the abovementioned electrode by a bonding wire and wiring (not illustrated).

The encapsulation layer 104 may protect the LEDs 103 from an exterior environment 190 by covering the LEDs 103. The encapsulation layer 104 may be formed by using a thermosetting resin, for example, at least one among a Si resin, an epoxy resin, and a phenol resin. A refractive index of the encapsulation layer 104 may be, for example, greater than or equal to 1.35 and less than 1.9.

The encapsulation layer 104 may include at least one of a red phosphor and a green phosphor scattered therein. The encapsulation layer 104 may thus be configured to emit at least one of red light and green light, respectively, when receiving light. In at least one example embodiment, the encapsulation layer 104 may exclude at least one phosphor. In at least one example embodiment, the encapsulation layer may exclude an entirety of phosphors.

The red phosphor is not particularly limited, but may be, for example, a CASN red phosphor ($CaAlSiN_3$:Eu). The green phosphor is not particularly limited, but may be, for example, a beta sialon ((β-sialon:Eu).

Blue light emitted from the LEDs 103, red light emitted from the red phosphor, and green light emitted from the green phosphor may be mixed with each other, and white light may thus be emitted by the light emitting apparatus 100.

A yellow phosphor may also be used in lieu of the red phosphor and the green phosphor. The yellow phosphor is not limited, but may be, for example, yttrium aluminum garnet (YAG).

The texture layer 105 may be disposed on the encapsulation layer 104, and may have a plurality of concentric ridge structures 105a on the surface thereof. Each of the concentric ridge structures 105a may have a linear, convex, and uneven structure.

The texture layer 105 may be formed by using a thermosetting resin, for example, at least one among a composition having a polysiloxane bond such as a Si resin, an epoxy resin, and a phenol resin.

The texture layer 105 may be configured to have 70% of light transmittance with regard to light having a wavelength of 550 nm, if and/or when the texture layer 105 a thickness of approximately 2 mm. Accordingly, higher light extraction efficiency of the light emitting apparatus 100 may be achieved. As referred to herein, a thickness of the texture layer 105 may be a maximum distance from a proximate to a distal end of the texture layer, relative to the encapsulation layer 104.

A cross section of each of the concentric ridge structures 105a in a radius direction $V_r$ of a concentric circle thereof (hereinafter referred to as "radial cross section of a concentric ridge structure") may have a triangular shape, where the triangular shape has a distal vertex 182 that is distal from the encapsulation layer 104, and each altitude angle 180 of the distal vertex 182 is less than or equal to 40 degrees. It will be understood, as described further below with regards to FIGS. 2A-B, that an altitude angle of the distal vertex 182 of a triangular shape refers to an angle between an altitude of the distal vertex and a side surface of the triangular shape. It will be understood that an altitude of a vertex refers to a line between a vertex of a triangle and an opposite side of the triangle, where the line is perpendicular to the opposite side. Thus, an altitude of the distal vertex 182 is perpendicular to a base of the triangular shape of the ridge structure, where the base is the proximate side of the triangular shape, relative to the encapsulation layer 104.

Figure 2B:
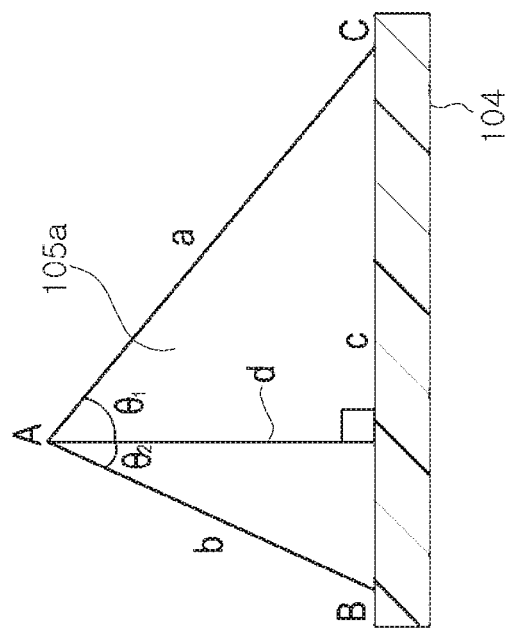
Figure 2C:
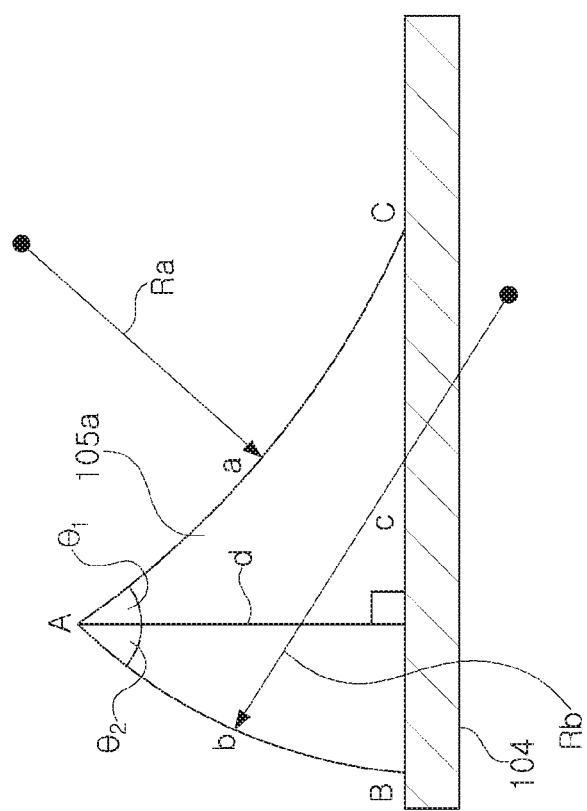
FIG. 2C is a view illustrating a cross section of a ridge structure having non-planar side surfaces, according to at least one example embodiment.

FIG. 2A and FIG. 2B are views illustrating cross sections of a ridge structure 105*a*, respectively, according to at least one example embodiment. FIG. 2C is a view illustrating a cross section of a ridge structure 105*a* having non-planar side surfaces, according to at least one example embodiment.

FIG. 2A illustrates a triangular shape ABC corresponding to a radial cross section of a ridge structure 105*a* according to at least one example embodiment. In the example embodiments shown in FIG. 2A, an altitude angle $\theta_1$ and an altitude angle $\theta_2$ are formed between an altitude d (also referred to herein as "altitude line d") of distal vertex A of the triangular shape ABC. Distal vertex A is a vertex that is farthest ("distal") from the encapsulation layer 104. Altitude d is a line between the distal vertex A and a bottom side c (also referred to as "base side c") that is an opposite side relative to the distal vertex A of the triangular shape ABC. The triangular shape ABC includes side surface a and side surface b forming the distal vertex A. The altitude d of distal vertex A is perpendicular to the base side c. Each altitude angle $\theta_1$ and $\theta_2$ is an angle between the altitude d and a separate side surface of the side surface a and side surface b forming the distal vertex A. The altitude angles $\theta_1$ and $\theta_2$ may each have a magnitude that is less than or equal to 40 degrees, respectively.

FIG. 2B illustrates a triangular shape ABC corresponding to a radial cross section of a concentric ridge structure 105*a* according to at least one example embodiment, where the triangular shape of the ridge structure 105*a* radial cross section is a right triangle. In the example embodiments shown in FIG. 2B, an altitude angle $\theta_2$ formed between a side surface b and an altitude d of the distal vertex A may be zero degrees in magnitude, as the altitude d may overlap the side surface b.

A reason why an altitude angle $\theta_1$ and the altitude angle $\theta_2$ of a distal vertex of the triangular shape ABC are required to be each less than or equal to 40 degrees in magnitude, respectively, in the triangular shape ABC corresponding to the cross section of the ridge structure will be described.

In the example embodiments illustrated in FIGS. 2A-B, each of the side surface a and the side surface b is a planar surface, such that each side surface extends along a respective plane. Referring to FIG. 2C, in at least one example embodiment, one or more of the side surface a and the side surface b is a non-planar surface. A non-planar surface may include a surface that extends beyond any individual plane. For example, anon-planar surface may include a curved surface, a surface including a plurality of planar sections that are not co-planar, some combination thereof, or the like. As shown in FIG. 2C, for example, at least one example embodiment of a ridge structure 105*a* may include a non-planar convex side surface b and a non-planar concave side surface a. The non-planar concave side surface a has a curvature with radius $R_a$, and the non-planar convex surface b has a curvature with radius $R_W$. In at least one example embodiment, one of side surfaces a and b may be planar and the other side surface may be non-planar.

Figure 3:
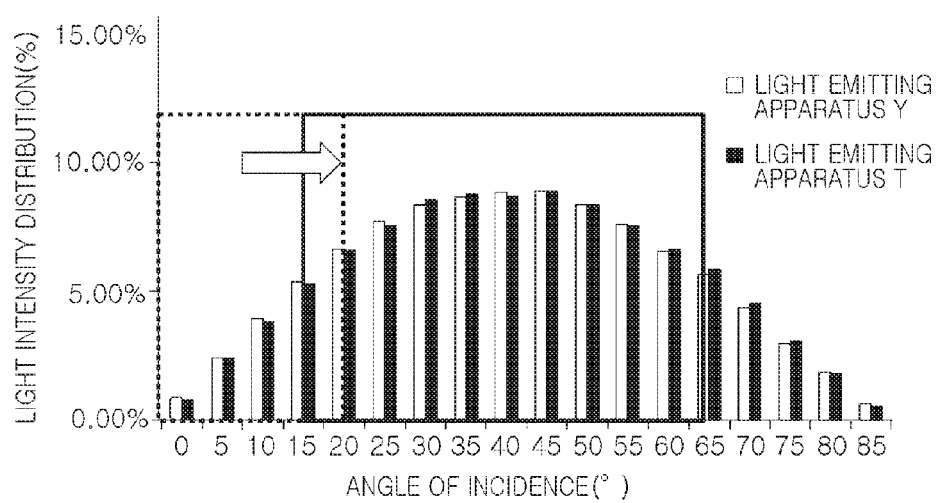
FIG. 3 is a graph illustrating distribution between light intensities and angles at which light emitted from an LED is received to a surface of an encapsulation layer, according to at least one example embodiment.

FIG. 3 is a graph illustrating a distribution between light intensities and angles at which light emitted from an LED is received to a surface of an encapsulation layer, according to at least one example embodiment. The vertical axis of the graph represents a ratio of an intensity of light received to the encapsulation layer 104 at each incident angle thereof to the total intensity of light received to the encapsulation layer 104. FIG. 3 illustrates the distribution of two light emitting apparatuses Y and T having different numbers of LEDs 103 and different package sizes, respectively.

As illustrated in FIG. 3, both of the two light emitting apparatuses Y and T may have incident angles at which light emitted from the LEDs 103 is received to the surface of the encapsulation layer 104, and each of which may cover a wide range of 0 degree to 90 degrees, and an intensity of the light may be strongest when the incident angle is about 45 degrees.

Therefore, in order to emit light having an incident angle of about 45 degrees from the surface of each of the ridge structures 105*a* to the outside of the light emitting apparatus 100 (e.g., the external environment 190), the altitude angles $\theta_1$ and $\theta_2$ of the distal vertex A of the triangular shape ABC corresponding to the cross section of each of the ridge structures 105*a* may be controlled. In other words, the altitude angles $\theta_1$ and $\theta_2$ may be controlled in such a manner that light having an incident angle of about 45 degrees may be received to an inclined plane (including the side surface a or the side surface b) included in each of the ridge structures 105*a* at a smaller incident angle, and that total reflection on the inclined plane may be designed to be difficult to achieve.

The altitude angles $\theta_1$ and $\theta_2$ may also be controlled in such a manner that return light reflected from the side surfaces a and b of each of the ridge structures 105*a* among light emitted from the LEDs 103 may be extracted as light emitted by the light emitting apparatus 100 by changing a direction of the return light to a direction of the light emitted by the light emitting apparatus 100 (a direction of an arrow illustrated in FIG. 1B). For this purpose, the altitude angles $\theta_1$ and $\theta_2$ may be required to be controlled to be less than or equal to 40 degrees, respectively, in the triangular shape ABC corresponding to the radial cross section of each of the ridge structures 105*a* to be described.

In at least one example embodiment illustrated in FIG. 3, a light emitting apparatus may exclude the texture layer 105 that includes the ridge structures 105*a* described herein. The range of light that is extracted from the light emitting device according to incidence angle of the light is illustrated in FIG. 3 by the box having broken lines. As shown, the light emitting apparatus that excludes the texture layer 105 may be configured to extract light having incidence angles between approximately 0 degrees and approximately 20 degrees.

In at least one example embodiment illustrated in FIG. 3, a light emitting apparatus may include the texture layer 105 that includes the ridge structures 105*a* described herein. The range of light that is extracted from the light emitting device according to incidence angle of the light is illustrated in FIG. 3 by the box having solid lines. As shown, the light emitting apparatus that includes the texture layer 105 may be configured to extract light having incidence angles between approximately 15 degrees and approximately 65 degrees.

Therefore, as shown in FIG. 3, a light emitting apparatus that includes the texture layer 105 may be configured to extract light having a greater range of incidence angles, relative to a light emitting apparatus that excludes the texture layer 105.

Furthermore, in the example embodiments illustrated in FIG. 3, the intensity of light extracted by the light emitting apparatus that includes the texture layer 105 is generally greater than the intensity of light extracted by the light emitting apparatus that excludes the texture layer 105, as the intensity of light having an incidence angle of 20-65 degrees is generally greater than the intensity of light having an incidence angle of 0-20 degrees. As such, a light emitting apparatus that includes the texture layer 105 described herein may be configured to extract a greater intensity of light emitted by an LED, relative to a light emitting apparatus that excludes the texture layer 105.

Figure 4:
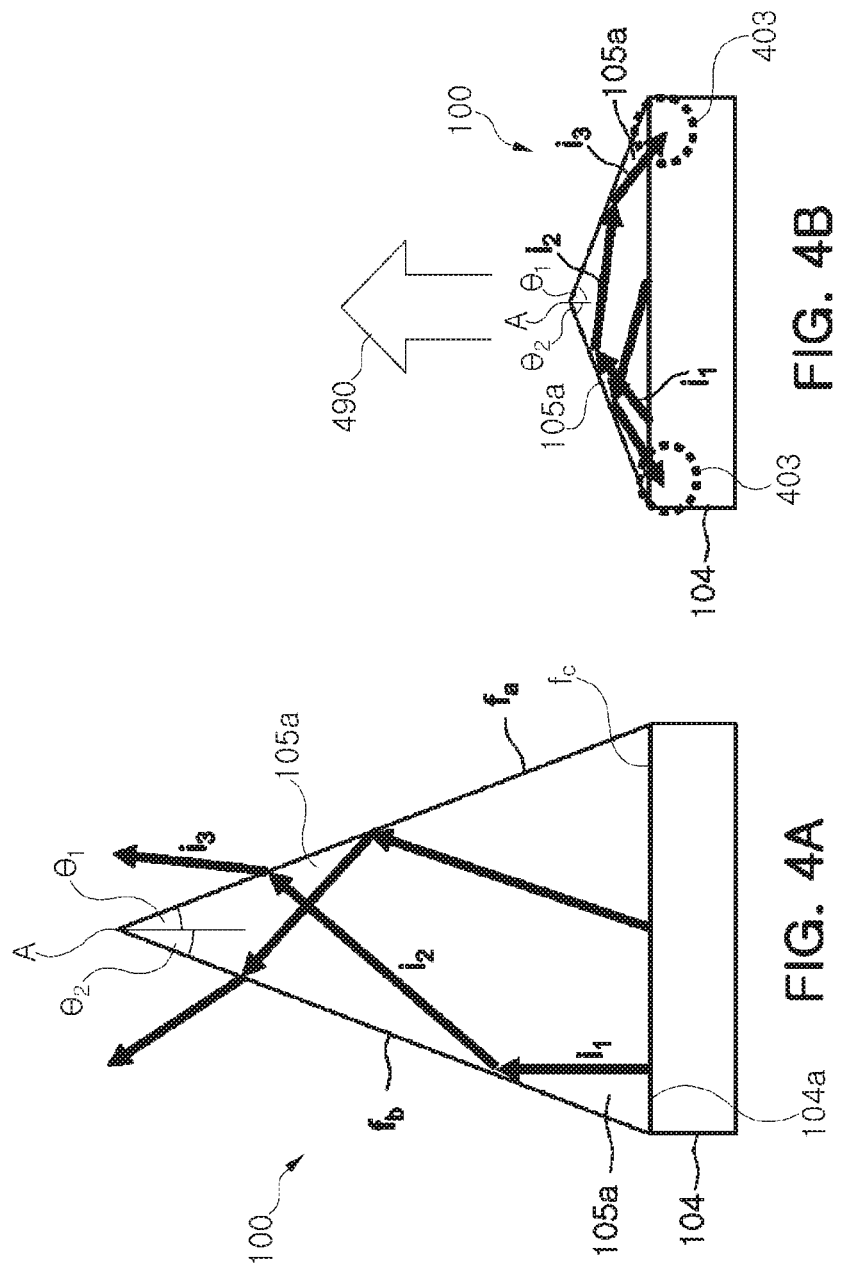
FIG. 4A and FIG. 4B are views illustrating directions of return light when an altitude angle $\theta_1$ and an altitude angle $\theta_2$ of a ridge structure are defined as 40 degrees or less, or as 40 degrees or more, respectively, according to at least one example embodiment.

FIG. 4A and FIG. 4B are views illustrating directions of return light when an altitude angle $\theta_1$ and an altitude angle $\theta_2$ are defined as 40 degrees or less, or as 40 degrees or more, respectively, according to at least one example embodiment. FIG. 4A is a view illustrating directions of return light when the altitude angles $\theta_1$ and $\theta_2$ of distal vertex A are equal to or less than 40 degrees, respectively. FIG. 4B is a view illustrating directions of return light when the altitude angles $\theta_1$ and $\theta_2$ of distal vertex A are greater than 40 degrees, respectively.

As illustrated in FIG. 4A, the altitude angles $\theta_1$ and $\theta_2$ may be controlled to be less than or equal to 40 degrees, respectively, and a direction of return ("internally reflected") light $i_2$, based on internal reflection, of light $i_1$ emitted from the LEDs 103 and through the encapsulation layer 104 to each of the ridge structures 105a, from a side surface $f_b$ of each of the ridge structures 105a. the internally reflected light $i_2$ may thus be refracted by side surface $f_a$ to a direction of light $i_3$ emitted by the light emitting apparatus 100. As a result, even in a case in which light emitted from the LEDs 103. As shown in FIG. 4A, the internally reflected light may be limited and/or prevented from returning toward the encapsulation layer 104, and the light may be suppressed from being attenuated due to a collision with a phosphor or the like included in the encapsulation layer 104. The ridge structure 105a may be configured to limit and/or prevent incident light $i_1$ entering the ridge structure 105a from the base surface $f_c$ from returning toward the encapsulation layer 104, and further configured to suppress the incident light $i_1$ from being attenuated due to a collision with a phosphor or the like included in the encapsulation layer 104, based on the altitude angles $\theta_1$ and $\theta_2$ of distal vertex A being equal to or less than 40 degrees, respectively.

Meanwhile, as illustrated in FIG. 4B, when the altitude angles $\theta_1$ and $\theta_2$ are controlled to be greater than 40 degrees, respectively, a direction of return ("internally reflected") light $i_2$ may be opposite to a direction 490 of light emitted by the light emitting apparatus 100 (e.g., the direction may be towards the encapsulation layer 104). In addition, the return light $i_2$ may be internally reflected by a side surface of each of the ridge structures 105a, and internally reflected return light $i_3$ may move toward the encapsulation layer 104 as illustrated in a broken line circle 403, and the internally reflected return light $i_3$ may be attenuated by colliding with the phosphor or the like included in the encapsulation layer 104. The light $i_3$ returning toward the encapsulation layer 104 may move in the direction 490 of light emitted by the light emitting apparatus 100 by colliding with the phosphor and being reflected by the mold frame 102, and may be externally emitted by the light emitting apparatus 100, but may be attenuated by the collision with the phosphor, thereby leading to a reduction in light extraction efficiency associated with the light emitting apparatus 100.

Therefore, the altitude angles $\theta_1$ and $\theta_2$ may be controlled to be less than or equal to 40 degrees, respectively, so that the direction of the return light $i_2$ reflected by the surface $f_b$ of each of the ridge structures 105a may be changed to the direction 490 of light emitted by the light emitting apparatus 100 to suppress attenuation of light caused by the reflection of the return light $i_2$, thereby increasing light extraction efficiency associated with the light emitting apparatus 100.

In addition, as described above, an incident angle at which light emitted from the LEDs 103 is received to the base surface $f_c$ of the ridge structure 105a at an interface of the base surface $f_c$ and the upper surface 104a of the encapsulation layer 104 may cover a wide range of 0 degrees to 90 degrees. This may cause a direction of the return light $i_2$ to not be changed to a direction 490 of light emitted by the light emitting apparatus 100 with regard to all light emitted from the LEDs 103 even if and/or when the altitude angles $\theta_1$ and $\theta_2$ of the distal vertex A are controlled to be less than or equal to 40 degrees, respectively. However, at least a ratio of light of which a direction of the return light $i_2$ is changed to a direction 490 of light emitted by the light emitting apparatus 100 to all light emitted from the LEDs 103 may be increased, relative to a light emitting apparatus 100 that includes a ridge structure 105a having a distal vertex A and one or more altitude angles of the distal vertex A that are greater than 40 degrees.

The altitude angles $\theta_1$ and $\theta_2$ may be controlled to be less than or equal to 40 degrees, respectively, so that an incident angle of internally reflected light (e.g., light $i_2$) received to a surface of each of the ridge structures 105a with respect to the surface may be decreased, thereby suppressing total reflection of the light on the surface of each of the ridge structures 105a and increasing light extraction efficiency of the light emitting apparatus 100.

Figure 5:
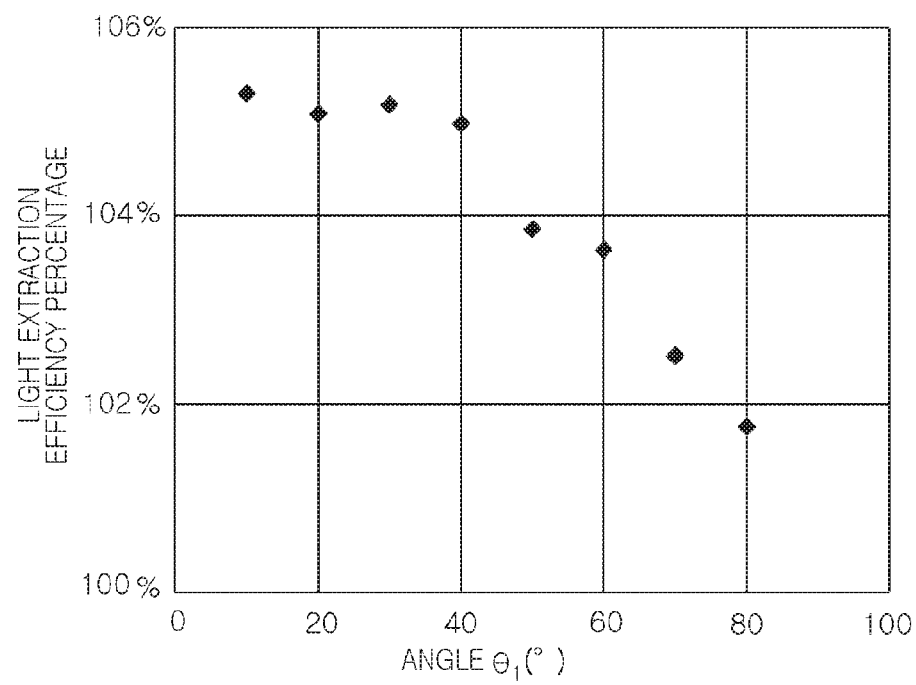
FIG. 5 is a view illustrating measurements of relations between altitude angles θ₁ and light extraction efficiency percentages of the light emitting apparatus when a cross section of the ridge structure is a right-angled triangle, according to at least one example embodiment.

FIG. 5 is a view illustrating measurements of relations between altitude angles $\theta_1$ of the distal vertex and light extraction efficiency percentages of the light emitting apparatus 100 when a cross section of the ridge structure is a right-angled triangle, according to at least one example embodiment. The right-angled triangle may have a side thereof perpendicular to a bottom side thereof outside the center of the concentric circle of each of the concentric ridge structures 105a. The light extraction efficiency ratios may be ratios of light extraction efficiency of a device to be measured to that of the device to be measured in which the texture layer 105 is not provided.

As illustrated in FIG. 5, it can be seen that the light extraction efficiency ratios are significantly increased by controlling the altitude angles $\theta_1$ to be 40 degrees or less, respectively.

The radial cross section of each of the concentric ridge structures 105a may be a right triangle that has a side thereof perpendicular to a bottom side (base surface) thereof outside (e.g., "distal to") a common center of the concentric circles defined by each of the concentric ridge structures 105a. Accordingly, the light extraction efficiency of the light emitting apparatus 100 may be further improved, and higher efficiency of the light emitting apparatus 100 may be achieved. Because the surfaces of each of the concentric ridge structures 105a including the side surface perpendicular to the bottom side of the right triangle, is disposed to be vertical to the surface of the encapsulation layer 104, and reflects light, a variation in the characteristics of light distribution due to the installation of the concentric ridge structures 105a may be controlled.

Returning to FIG. 1, the texture layer 105 may be disposed on 80% or more of the area of the surface of the encapsulation layer 104, and may not be disposed on a central region S of the surface of the encapsulation layer 104 including the common center 192 of the concentric circles defined by each of the concentric ridge structures 105a.

Accordingly, a through hole may be provided in a portion of a mold for forming the concentric ridge structures 105a, the portion corresponding to the central region S, to penetrate through the mold in a thickness direction of the mold, and vacuum suction through the through hole may be performed. The vacuum suction may allow a portion of the mold corresponding to the concentric ridge structures 105a to be filled with a material of the texture layer 105 up to a front end of the portion. In particular, when a releasing agent is coated onto a surface of the mold, a difference between surface free energies of the releasing agent and the material of the texture layer 105 may cause a gap between the releasing agent and the material of the texture layer 105 to be likely to occur. In this case, vacuum suction through the through hole provided in the portion of the mold corresponding to the region S may limit and/or prevent a gap between the releasing agent and the material of the texture layer 105 from occurring, and may control a reduction in apparatus yield caused by the nonexistence of the vertex A of each of the concentric ridge structures 105a.

A reason why the texture layer 105 is provided on 80% or more of the area of the surface of the encapsulation layer 104 when the region S not including the texture layer 105 is provided will be described.

Figure 6:
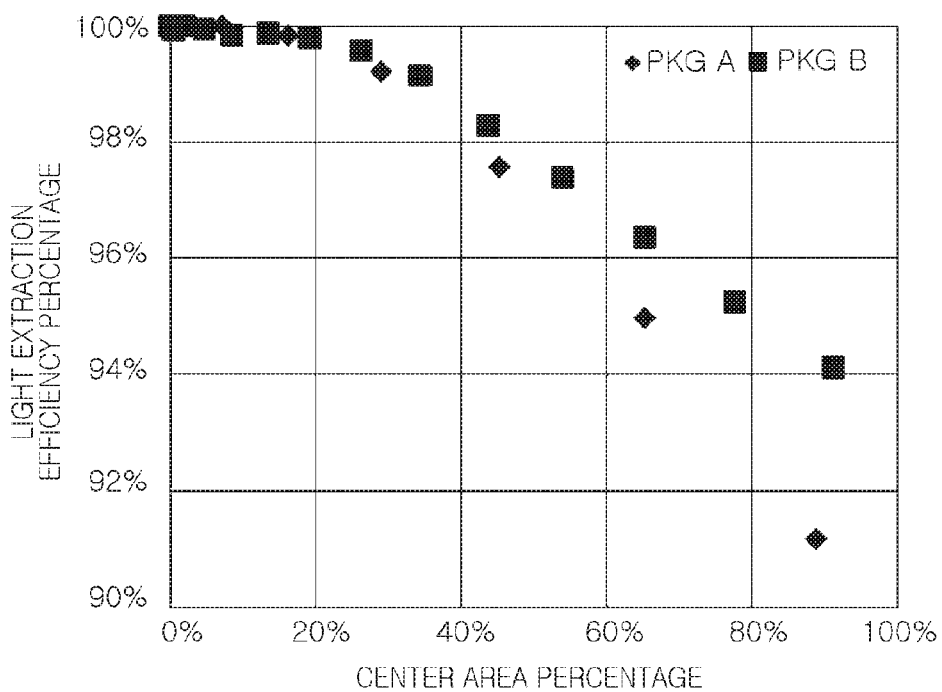
FIG. 6 is a view illustrating measurements of relations between light extraction efficiency percentages and center area percentages, each of which is a ratio of a region not including the ridge structure on an entire surface of a texture layer to the entire surface, according to at least one example embodiment.

FIG. 6 is a view illustrating measurements of relations between light extraction efficiency percentages and center area percentages, each of which is a ratio of a region not including the ridge structure on an entire surface of a texture layer to the entire surface, according to at least one example embodiment. FIG. 6 is a view illustrating measurements of relations between light extraction efficiency ratios and center area ratios that are ratios of a plurality of the region S not including the texture layer 105 on the entire surface of the encapsulation layer 104 to the entire surface. FIG. 6 illustrates measurements with regard to two light emitting apparatuses A and B having different numbers of LEDs 103 and different package sizes, respectively.

As illustrated in FIG. 6, the light extraction efficiency ratios of the light emitting apparatus may be significantly reduced when the center area ratios exceed 20%. Therefore, the region S not including the texture layer 105 may be provided on the portion of the surface of the encapsulation layer 104 including the center of the concentric circle of each of the concentric ridge structures 105a, and the texture layer 105 may be provided on 80% or more of the area of the surface of the encapsulation layer 104. Accordingly, the apparatus yield may be increased by improving moldability of the concentric ridge structures 105a without a deterioration in the light extraction efficiency.

A method of manufacturing the light emitting apparatus 100 will be described.

FIG. 7A, FIG. 7B, FIG. 7C, and FIG. 7D are views illustrating a method of manufacturing a light emitting apparatus, respectively, according to at least one example embodiment.

Figure 7A:
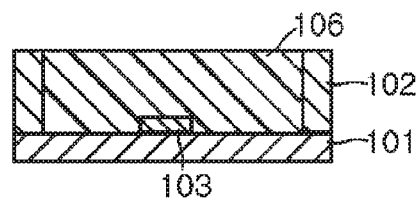
FIG. 7A, FIG. 7B, FIG. 7C, and FIG. 7D are views illustrating a method of manufacturing a light emitting apparatus, respectively, according to at least one example embodiment.

As illustrated in FIG. 7A, an LED 103 may be mounted in a package in which a mold frame 102 is provided on a substrate 101, and an encapsulant 106 of a silicone resin including a phosphor powder may be coated onto the LED 103 to cover the LED 103.

Figure 7B:
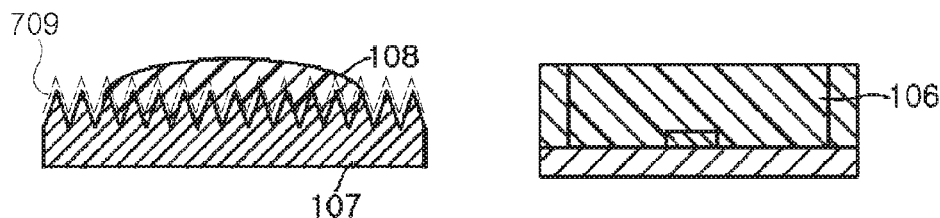

As illustrated in FIG. 7B, a releasing agent 709 may be coated onto a surface of a mold 107 for forming a plurality of ridge structures 105a each having a 100 μm pitch, and may be heated at 150° C. for 30 min. to be dried, and a silicone resin 108, a material of each of the ridge structures 105a, may be coated onto the releasing agent. A phosphor may not be included in the silicone resin 108. Thereafter, the silicone resin 108 may be dried for 5 min. to 30 min. under a vacuum atmosphere of 50° C. so that viscosity of the silicone resin 108 may be reduced.

Figure 7C:
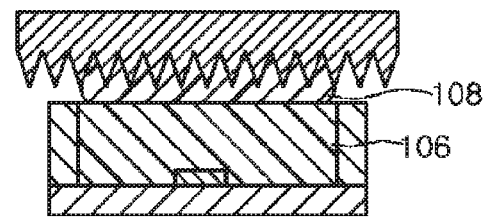

As illustrated in FIG. 7C, the surface of the mold 107 and an upper surface of the encapsulant 106 may face each other in such a manner that the silicone resin 108 coated on the surface of the mold 107 may come into close contact with the encapsulant 106. In this case, since the encapsulant 106 is not subjected to a thermosetting treatment, the silicone resin 108 and the encapsulant 106 may come into close contact with each other while the upper surface of the encapsulant 106 is moved upwardly in a vertical direction and the surface of the mold 107 is moved downwardly in the vertical direction. When the silicone resin 108 and the encapsulant 106 come into close contact with each other, the mold 107 and the substrate 101 stacked with each other may be pressurized at a pressure of 0.1 MPa to 1 MPa while being heated at 150° C. for 30 min. Accordingly, the silicone resin 108 may be hardened by heat in a state in which the mold 107 is filled with a sufficient amount of the silicone resin 108 while the encapsulation layer 104 is formed of the thermally cured encapsulant 106.

Figure 7D:
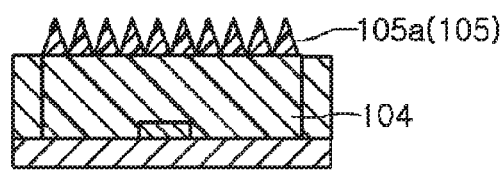

As illustrated in FIG. 7D, the encapsulant 106 and the silicone resin 108 may be simultaneously hardened by heat, and the silicone resin 108 may be separated from the mold 107, thereby forming a texture layer 105 having the ridge structures 105a on the surface of the encapsulation layer 104.

The method of manufacturing the light emitting apparatus 100 according to the first example embodiment may allow the encapsulation layer 104 and the texture layer 105 having the ridge structures 105a to be thermally cured while the encapsulation layer 104 and the texture layer 105 are formed. Accordingly, a time required for manufacturing the light emitting apparatus 100 may be reduced. The encapsulation layer 104 and the texture layer 105 may be hardened by heat substantially at the same time to limit and/or prevent an interface from being generated between the encapsulation layer 104 and the texture layer 105, thereby avoiding light from being attenuated at the interface.

After the encapsulation layer 104 is formed of the thermally cured encapsulant 106, the encapsulation layer 104 and the silicone resin 108 coated on the surface of the mold 107 may come into close contact with each other, and the silicone resin 108 may be subjected to a thermosetting treatment, thereby forming the ridge structures 105a on the encapsulation layer 104. Accordingly, the light emitting apparatus 100 configured to reduce the possibility that the phosphor included in the encapsulant 106 in the back of the ridge structures 105a is diffused, to include the phosphor only in the encapsulation layer 104, and to not include the phosphor in the texture layer 105 may be manufactured. The light emitting apparatus 100 may be configured to include the phosphor only in the encapsulation layer 104 and not include the phosphor in the texture layer 105 to suppress intensity of light from being reduced due to a collision between the light and the phosphor, thereby increasing efficiency of the light emitting apparatus 100.

FIG. 8A, FIG. 8B, FIG. 8C, FIG. 8D, and FIG. 8E are views illustrating a method of manufacturing a light emitting apparatus, respectively, according to at least one example embodiment. FIG. 9A is a plan view illustrating a structure of a light emitting apparatus manufactured by the method of manufacturing a light emitting apparatus, according to at least one example embodiment. FIG. 9B is a cross-sectional view illustrating the structure of the light emitting apparatus manufactured by the method of manufacturing a light emitting apparatus, according to at least one example embodiment. FIG. 9B is a cross-sectional view taken along line IXB-IXB' of FIG. 9A.

Figure 8A:
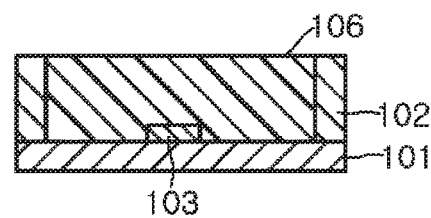
FIG. 8A, FIG. 8B, FIG. 8C, FIG. 8D, and FIG. 8E are views illustrating a method of manufacturing a light emitting apparatus, respectively, according to at least one example embodiment.

As illustrated in FIG. 8A, an LED 103 may be mounted in a package in which a mold frame 102 is provided on a substrate 101, and an encapsulant 106 of a silicone resin including a phosphor powder may be coated onto the LED 103 to cover the LED 103.

Figure 8B:
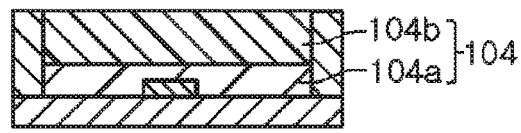

Thereafter, as illustrated in FIG. 8B, the encapsulant 106 may be dried for 2 hours at 50° C. so that viscosity of the encapsulant 106 may be reduced, thereby depositing the phosphor included in the encapsulant 106 in a direction of the substrate 101. Accordingly, because the encapsulant 106 may be divided into a layer including the phosphor and a layer not including the phosphor, the encapsulant 106 may be thermally cured by being heated for 1 hour at 150° C. so that a first encapsulation layer 104a of a region including the phosphor and a second encapsulation layer 104b of a region not including the phosphor may be simultaneously formed as a body.

Figure 8C:
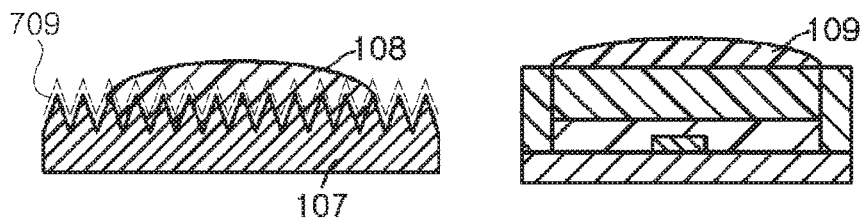

As illustrated in FIG. 8C, a releasing agent 709 may be coated onto a surface of a mold 107 for forming a plurality of ridge structures 105a each having a 100 μm pitch, and may be heated at 150° C. for 30 min. to be dried, and a silicone resin 108, a material of each of the ridge structures 105a, may be coated onto the releasing agent. Meanwhile, a silicone resin 109, a material of each of the ridge structures 105a, may also be coated onto a surface of an encapsulation layer 104. The silicone resins 108 and 109 may not include the phosphor. Thereafter, the silicone resins 108 and 109 may be dried for 5 min. to 30 min. under a vacuum atmosphere of 50° C. so that viscosities of the silicone resins 108 and 109 may be reduced.

Figure 8D:
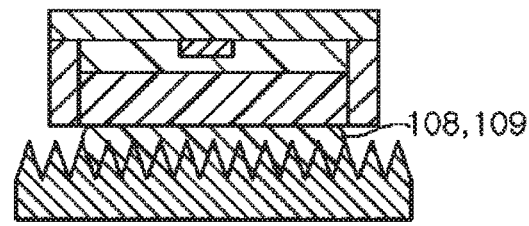

As illustrated in FIG. 8D, the surface of the mold 107 and the surface of the encapsulant 104 may face each other in such a manner that the silicone resin 108 coated on the surface of the mold 107 may come into close contact with the silicone resin 109 coated on the surface of the encapsulation layer 104. In this case, since the encapsulant 104 is subjected to a thermosetting treatment, the silicone resin 108 and the silicone resin 109 may come into close contact with each other in a state in which the surface of the encapsulation layer 104 is moved downwardly in a vertical direction and the surface of the mold 107 is moved upwardly in the vertical direction. When the silicone resin 108 and the silicone resin 109 come into close contact with each other, the mold 107 and the substrate 101 stacked with each other may be pressurized at a pressure of about 0.1 MPa to 1 MPa while being heated at 150° C. for 30 min. Accordingly, the silicone resins 108 and 109 may be thermally cured while the mold 107 is filled with a sufficient amount of the silicone resins 108 and 109.

Figure 8E:
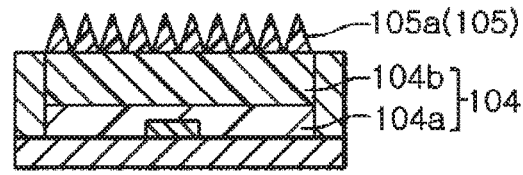

As illustrated in FIG. 8E, the silicone resins 108 and 109 may be hardened by heat, and may be separated from the mold 107, thereby forming a texture layer 105 having the ridge structures 105a on the surface of the encapsulation layer 104.

As illustrated in FIG. 9A and FIG. 9B, the light emitting apparatus 100 manufactured according to the second example embodiment may also have a configuration in which the texture layer 105 is not disposed on a region S of the surface of the encapsulation layer 104 including a center of a concentric circle of each of the concentric ridge structures 105a. In this case, the texture layer 105 may be disposed on 80% or more of an area of the surface of the encapsulation layer 104. According to the method of manufacturing the light emitting apparatus 100 according to at least one example embodiment, the light emitting apparatus 100 may be manufactured to have a configuration in which a first encapsulation layer 104a, a region including a phosphor, is limited to the vicinity of the LED 103, and a second encapsulation layer 104b, a region not including a phosphor, is disposed on a side of the surface of the encapsulation layer 104. The first encapsulation layer 104a, the region including the phosphor, may be limited to the vicinity of the LED 103 to lower the probability of a reduction in light intensity caused by return light colliding with the phosphor. The first encapsulation layer 104a may be preferably configured to have a height less than or equal to 50% of a full height (thickness) of the encapsulation layer 104. This may lower the probability of a reduction in light intensity caused by return light colliding with the phosphor more effectively.

The first encapsulation layer 104a, the region including the phosphor, and the second encapsulation layer 104b, the region not including the phosphor, may be thermally cured substantially at the same time to limit and/or prevent an interface between the first encapsulation layer 104a and the second encapsulation layer 104b from being generated, thereby avoiding light from being attenuated at the interface.

In at least one example embodiment, the first encapsulation layer 104a, the region including the phosphor, and the second encapsulation layer 104b, the region not including the phosphor, may be thermally cured substantially at the same time, but may be separately subjected to thermosetting treatments, respectively. In this case, a phosphor may be contained only in a material of the first encapsulation layer 104a, and the light emitting apparatus 100 having the first encapsulation layer 104a, the region including the phosphor, and the second encapsulation layer 104b, the region not including the phosphor, may thus be manufactured. Accordingly, the layer containing the phosphor and the layer not containing the phosphor may be separated from each other more clearly, and the probability in which light intensity is reduced due to a collision between return light and the phosphor may thus be further lowered.

A light emitting apparatus according to at least one example embodiment of the inventive concepts may have the following effects.

Each of a plurality of concentric ridge structures may be provided on a surface of a texture layer on an encapsulation layer, each concentric ridge structure having a cross section having a triangular shape in which a perpendicular line from a vertex of the triangular shape farthest from the encapsulation layer to a bottom side of the triangular shape, and sides forming the vertex, form angles less than or equal to 40 degrees, respectively. This may allow a direction in which light is reflected from the surfaces of the concentric ridge structures to be changed to a direction in which light is emitted by a light emitting apparatus to efficiently extract light reflected within the texture layer, thereby achieving high efficiency of the light emitting apparatus. Because total reflection of light, which has the highest intensity among light emitted from an LED and is received to the surface of the encapsulation layer at an incident angle of about 45 degrees, on the surfaces of the concentric ridges structures may also be suppressed, higher efficiency of the light emitting apparatus may be achieved. Further, the concentric ridge structures may be provided on the surface of the encapsulation layer to increase a surface area of the texture layer to improve heat dissipation properties, thereby improving reliability of the light emitting apparatus.

In addition, the cross section of each of the concentric ridge structures may have the shape of a right-angled triangle which has a side thereof perpendicular to a bottom side thereof outside a center of a concentric circle of each of the concentric ridge structures. Accordingly, higher efficiency of the light emitting apparatus may be achieved. Because the surface of each of the concentric ridge structures including the side perpendicular to the bottom side of the right-angled triangle is disposed to be vertical to the surface of the encapsulation layer, and reflects light, a variation in the characteristics of light distribution due to the installation of the concentric ridge structures may be controlled.

A region not having the texture layer may be provided on a portion of the surface of the encapsulation layer including the center of the concentric circle of each of the concentric ridge structures, and the texture layer may be provided on 80% or more of an area of the surface of the encapsulation layer. Accordingly, a deterioration in light extraction efficiency may be limited and/or prevented, apparatus yield may be increased by improving moldability of the concentric ridge structures, and productivity may be increased.

Further, the texture layer may not include a phosphor. Accordingly, the probability that light intensity is reduced when return light collides with the phosphor may be lowered, and the return light may be extracted as emitted light, thereby achieving higher efficiency of the light emitting apparatus.

The texture layer may also be configured to have 70% of light transmittance with regard to light having a wavelength of 550 nm when having a thickness of 2 mm. Accordingly, higher efficiency of the light emitting apparatus may be achieved.

In addition, the texture layer and the encapsulation layer may have the same refractive index as each other. Accordingly, light may be limited and/or prevented from being reflected at an interface between the texture layer and the encapsulation layer, thereby achieving higher efficiency of the light emitting apparatus. The encapsulation layer and the texture layer may include the same material as each other, and may be thermally cured at the same time to limit and/or prevent an interface from being generated between the encapsulation layer and the texture layer, thereby avoiding light from being attenuated at the interface.

Meanwhile, the light emitting apparatus according to the inventive concepts is not limited to the abovementioned example embodiment.

For example, the abovementioned example embodiment illustrates a plurality of concentric ridge structures as having the same cross section as each other, but the plurality of concentric ridge structures may have different cross sections, respectively.

Further, the abovementioned example embodiment illustrates the light emitting apparatus as a light emitting apparatus emitting white light, but the light emitting apparatus may be provided as a light emitting apparatus emitting light other than the white light.

As set forth above, according to at least one example embodiment of the inventive concepts, each of a plurality of concentric ridge structures may be provided on a surface of a texture layer on an encapsulation layer, each concentric ridge structure having a cross section having a triangular shape in which a perpendicular line from a vertex of the triangular shape farthest from the encapsulation layer to a bottom side of the triangular shape, and sides forming the vertex, form angles less than or equal to 40 degrees, respectively. This may allow a direction in which light is reflected from the surfaces of the concentric ridge structures to be changed to a direction in which light is emitted by a light emitting apparatus to efficiently extract light reflected within the texture layer, thereby achieving high efficiency of the light emitting apparatus. Because total reflection of light, which has the highest intensity among light emitted from the LED and is received to the surface of the encapsulation layer at an incident angle of about 45 degrees, on the surfaces of the concentric ridges structures may be suppressed, higher efficiency of the light emitting apparatus may be achieved.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A light emitting apparatus, comprising:
a light emitting device on a substrate;
an encapsulation layer covering the light emitting device; and
a texture layer on the encapsulation layer, the texture layer including,
at least one ridge structure defining at least one circle around a common center, the at least one ridge structure having a radial cross section, the radial cross section having a triangular shape, the triangular shape having a distal vertex that is distal from the encapsulation layer, and each altitude angle of the distal vertex being less than or equal to 40 degrees, respectively,
wherein the texture layer has a thickness of approximately 2 mm, and the texture layer has a light transmittance, of light emitted by the light emitting device and transmitted to the texture layer through the encapsulation layer, of at least 70% with regard to light having a wavelength of 550 nm.

2. The light emitting apparatus of claim 1, wherein,
the triangular shape includes a base that is proximate to the encapsulation layer;
the triangular shape includes a side surface that is distal from the common center of the at least one circle; and
the triangular shape is a right triangle, such that the distal side surface is perpendicular to the base of the triangular shape.

3. The light emitting apparatus of claim 1, wherein,
the texture layer is on at least 80% of an area of a surface of the encapsulation layer, and
the texture layer exposes a central portion of the surface of the encapsulation layer, the central portion including the common center of the at least one circle defined by the at least one ridge structure.

4. The light emitting apparatus of claim 1, wherein the texture layer excludes a phosphor.

5. The light emitting apparatus of claim 1, wherein the texture layer and the encapsulation layer have a common refractive index.

6. The light emitting apparatus of claim 1, further comprising:
a mold frame surrounding the encapsulation layer.

7. A light emitting apparatus, comprising:
a light emitting device on a substrate;
a first encapsulation layer covering the light emitting device;

a second encapsulation layer on the first encapsulation layer; and a texture layer on the second encapsulation layer, wherein, a surface of the texture layer includes a plurality of concentric ridge structures, a radial cross section of each of the concentric ridge structures has a triangular shape in which an altitude line of a distal vertex of the triangular shape relative to the second encapsulation layer, and side surfaces forming the distal vertex, form altitude angles that are each less than or equal to 40 degrees, respectively, the texture layer is on at least 80% of an area of a surface of the second encapsulation layer, and the texture layer exposes a central portion of the surface, the central portion including the common center defined by the plurality of concentric ridge structures.

8. The light emitting apparatus of claim 7, wherein the first encapsulation layer includes a phosphor.

9. The light emitting apparatus of claim 7, wherein the first encapsulation layer and the second encapsulation layer have a common refractive index.

10. The light emitting apparatus of claim 7, wherein,
the triangular shape includes a base that is proximate to the second encapsulation layer;
the triangular shape includes a side surface that is distal from a common center of the plurality of concentric ridge structures; and
the triangular shape is a right triangle, such that the distal side surface is perpendicular to the base of the triangular shape.

11. The light emitting apparatus of claim 7, wherein,
the texture layer has a thickness of approximately 2 mm; and
the texture layer has a light transmittance of light emitted by the light emitting device and transmitted to the texture layer through the second encapsulation layer, of at least 70% with regard to light having a wavelength of 550 nm.

12. The light emitting apparatus of claim 7, wherein the texture layer and the second encapsulation layer have a common refractive index.

13. A light emitting apparatus, comprising:
a light emitting device on a substrate;
a first encapsulation layer covering the light emitting device;
a second encapsulation layer on the first encapsulation layer; and
a texture layer on the second encapsulation layer, the texture layer including,
at least one ridge structure defining at least one circle around a common center, the at least one ridge structure having a radial cross section, the radial cross section having a triangular shape, the triangular shape having a distal vertex that is distal from the second encapsulation layer, and each altitude angle of the distal vertex being less than or equal to 40 degrees, respectively,
wherein the texture layer is on at least 80% of an area of a surface of the second encapsulation layer, and the texture layer exposes a central portion of the surface, the central portion including the common center of the at least one circle defined by the at least one ridge structure.

14. The light emitting apparatus of claim 13, wherein,
the at least one ridge structure includes a plurality of concentric ridge structures defining separate, respective concentric circles around the common center.

15. The light emitting apparatus of claim 13, wherein,
at least one side surface of the at least one ridge structure is a planar surface.

16. The light emitting apparatus of claim 13, wherein the first encapsulation layer and the second encapsulation layer have a common refractive index.

17. The light emitting apparatus of claim 13, wherein,
the triangular shape includes a base that is proximate to the second encapsulation layer;
the triangular shape includes a side surface that is distal from the common center of the at least one circle; and
the triangular shape is a right triangle, such that the distal side surface is perpendicular to the base of the triangular shape.

* * * * *